United States Patent
Huang

(10) Patent No.: US 7,576,608 B1
(45) Date of Patent: Aug. 18, 2009

(54) AMPLIFIER CIRCUIT WITH VOLTAGE INTERPOLATION FUNCTION

(75) Inventor: Ju-Lin Huang, Taipei County (TW)

(73) Assignee: NOVATEK Microelectronics Corp., Hsin-Chu (TW)

( * ) Notice: Subject to any disclaimer, the term of this patent is extended or adjusted under 35 U.S.C. 154(b) by 0 days.

(21) Appl. No.: 12/121,753

(22) Filed: May 15, 2008

(30) Foreign Application Priority Data

Feb. 20, 2008 (TW) ............................... 97105889 A

(51) Int. Cl.
*H03F 3/45* (2006.01)
(52) U.S. Cl. ...................... 330/253; 330/301; 330/261; 341/145
(58) Field of Classification Search ................ 330/253, 330/301, 261; 341/145
See application file for complete search history.

(56) References Cited

U.S. PATENT DOCUMENTS

| 5,640,163 | A  | * | 6/1997 | Nauta et al. | .................. 341/155 |
| 6,445,248 | B1 | * | 9/2002 | Gilbert | ......................... 330/51 |
| 7,368,990 | B2 | * | 5/2008 | Tsuchi | ......................... 330/261 |
| 7,382,190 | B2 | * | 6/2008 | Gilbert | ......................... 330/254 |
| 7,443,234 | B2 | * | 10/2008 | Iriguchi | .......................... 330/9 |

* cited by examiner

*Primary Examiner*—Patricia Nguyen
(74) *Attorney, Agent, or Firm*—Winston Hsu

(57) ABSTRACT

An amplifier circuit with a voltage interpolation function includes an N-type differential pair and a P-type differential pair. The N-type differential pair includes a first transconductance value, and has a first differential input terminal coupled to a first voltage and a second differential input terminal coupled to a voltage output terminal. The P-type differential pair includes a second transconductance value, and has a first differential input terminal coupled to a second voltage and a second differential input terminal coupled to the voltage output terminal. The N-type differential pair and the P-type differential pair are further coupled to the voltage output terminal through an output stage, and voltages outputted by the voltage output terminal are interpolation results of the first voltage and the second voltage weighted by the first transconductance value and the second transconductance value.

12 Claims, 4 Drawing Sheets

US 7,576,608 B1

AMPLIFIER CIRCUIT WITH VOLTAGE INTERPOLATION FUNCTION

BACKGROUND OF THE INVENTION

1. Field of the Invention

The present invention relates to an amplifier circuit with a voltage interpolation function, and more particularly, to an amplifier circuit utilizing fewer differential pairs for realizing the voltage interpolation function.

2. Description of the Prior Art

With increases in size and resolution of liquid crystal display (LCD) panels, layout area of driver chips is also increasing, and thus, industry professionals must focus on ways to reduce chip area and production cost. Please refer to FIG. 1. FIG. 1 is a schematic diagram of a driver chip 10 in a conventional LCD panel. The driver chip 10 is utilized for converting an image signal S_DATA with a resolution of N bits to an analog output voltage Vo for driving corresponding pixels, and includes $2^N$ reference voltage wirings 11, a digital-to-analog converter 12 and a voltage buffer 13. The reference voltage wirings 11 are utilized for providing $2^N$ Gamma reference voltages generated by a reference voltage generator (not shown in FIG. 1). The digital-to-analog converter 12 is utilized for switching to output one of the $2^N$ Gamma reference voltages according to the image signal S_DATA. The voltage buffer 13 then generates the analog output voltage Vo needed by rear stage circuits according to the reference voltage outputted by the digital-to-analog converter 12, and provides adequate driving currents for the rear stage circuits as well.

As shown in FIG. 1, an N-bit driver chip generally requires $2^N$ reference voltage wirings, and thus, when the resolution of the driver chips is increased, the number of the reference voltage wirings 11 and circuit elements inside the analog-to-digital converter 12 increases greatly, resulting in considerable chip sizes. In this case, if the voltage buffer 13 can be realized by amplifier circuits with voltage interpolation functions, half the number of the reference voltage wirings 11 and the circuit elements inside the analog to digital converter 12 can be removed, since the reference voltages being removed are made up for by interpolation of the amplifier circuits.

Please refer to FIG. 2. FIG. 2 is a schematic diagram of a conventional amplifier circuit 20 with a function of voltage interpolation. The amplifier circuit 20 is utilized for interpolating input voltages V1 and V2 to generate an output voltage Vo according to a superposition principle, and includes N-type differential pairs 21 and 22, P-type differential pairs 23 and 24, and an output stage 25. The N-type differential pairs 21 and 22 have a circuit structure similar to that of a Gilbert cell, and are respectively formed with two matched N-type transistors and one biasing transistor. Input terminals of the N-type differential pairs 21, i.e. gate electrodes of transistors MN1 and MN2, are respectively coupled to the first input voltage V1 and the output voltage Vo, while input terminals of the N-type differential pairs 22, i.e. gate electrodes of transistors MN3 and MN4, are respectively coupled to the second input voltage V2 and the output voltage Vo. Similarly, the P-type differential pairs 23 and 24 also have a circuit structure similar to that of a Gilbert cell, in which input terminals of the P-type differential pairs 23, i.e. gate electrodes of transistors MP1 and MP2, are respectively coupled to the first input voltage V1 and the output voltage Vo, while input terminals of the P-type differential pairs 24, i.e. gate electrodes of transistors MP3 and MP4, are respectively coupled to the second input voltage V2 and the output voltage Vo. Further, output terminals of the N-type differential pairs 21 and 22 are respectively coupled to the output stage 25 through nodes A and B, and output terminals of the P-type differential pairs 23 and 24 are respectively coupled to the output stage 25 through nodes C and D.

In operation, since output currents of the differential pairs are proportional to the product of input voltages and their transconductances, if the transconductances of the N-type differential pairs 21 and 22 are adjusted to be the same, the output voltage Vo generated by the N-type differential pairs 21 and 22 will be an average value of the first input voltage V1 and the second input voltage V2. Likewise, if the transconductances of the P-type differential pairs 23 and 24 are adjusted to be the same, the output voltage Vo generated by the P-type differential pairs 23 and 24 will be an average value of the first input voltage V1 and the second input voltage V2 as well. The adjustment of the transconductances of the differential pairs can be achieved by adjusting corresponding bias currents or transistor sizes, which is well known by those in the art and not narrated herein. Therefore, by the superposition principle, the output voltage Vo can be expressed as follows:

$$Vout = \frac{(gmp + gmn)V1 + (gmp + gmn)V2}{2(gmp + gmn)},$$

in which gmn and gmp respectively represent the transconductances of the N-type differential pairs and the P-type differential pairs, so the output voltage Vo is equal to the average value of the input voltages V1 and V2.

Therefore, when using the amplifier circuit 20 with the voltage interpolation function in the driver chips, additional reference voltages can be generated for reducing required reference voltage wirings and the number of circuit elements inside the digital-to-analog converter, so as to reduce chip sizes and lower production cost. However, the amplifier circuit with the voltage interpolation function has to use two sets of the N-type and the P-type differential pairs, which increases the circuit area of the voltage buffer circuit itself instead.

SUMMARY OF THE INVENTION

It is therefore an objective of the present invention to provide an amplifier circuit with the voltage interpolation function and a driving device using the same.

According to the present invention, an amplifier circuit with a voltage interpolation function is disclosed. The amplifier circuit comprises an N-type differential pair having a first transconductance value, the N-type differential pair comprising a first differential input terminal coupled to a first voltage and a second differential input terminal coupled to a voltage output terminal; and a P-type differential pair having a second transconductance value, the P-type differential pair comprising a first differential input terminal coupled to a second voltage and a second differential input terminal coupled to the voltage output terminal. The N-type differential pair and the P-type differential pair are further coupled to the voltage output terminal through an output stage, and an output voltage of the voltage output terminal is an interpolation result of the first voltage and the second voltage weighted by the first transconductance value and the second transconductance value.

According to the present invention, a driving device of a liquid crystal display for reducing layout area is further disclosed. The driving device comprises a digital-to-analog converter and a buffer amplifier. The digital-to-analog converter is utilized for outputting a first reference voltage and a second reference voltage from a plurality of reference voltages according to a digital signal, wherein the first reference voltage and the second reference voltage are adjacent reference voltages among the plurality of reference voltages. The buffer amplifier is coupled to the digital-to-analog converter, and comprises an N-type differential pair having a first transconductance value, the N-type differential pair comprising a first differential input terminal coupled to the first reference voltage and a second differential input terminal coupled to a voltage output terminal; and a P-type differential pair having a second transconductance value, the P-type differential pair comprising a first differential input terminal coupled to the second reference voltage and a second differential input terminal coupled to the voltage output terminal. The N-type differential pair and the P-type differential pair are further coupled to the voltage output terminal through an output stage, and an output voltage of the voltage output terminal is an interpolation result of the first reference voltage and the second reference voltage weighted by the first transconductance value and the second transconductance value.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
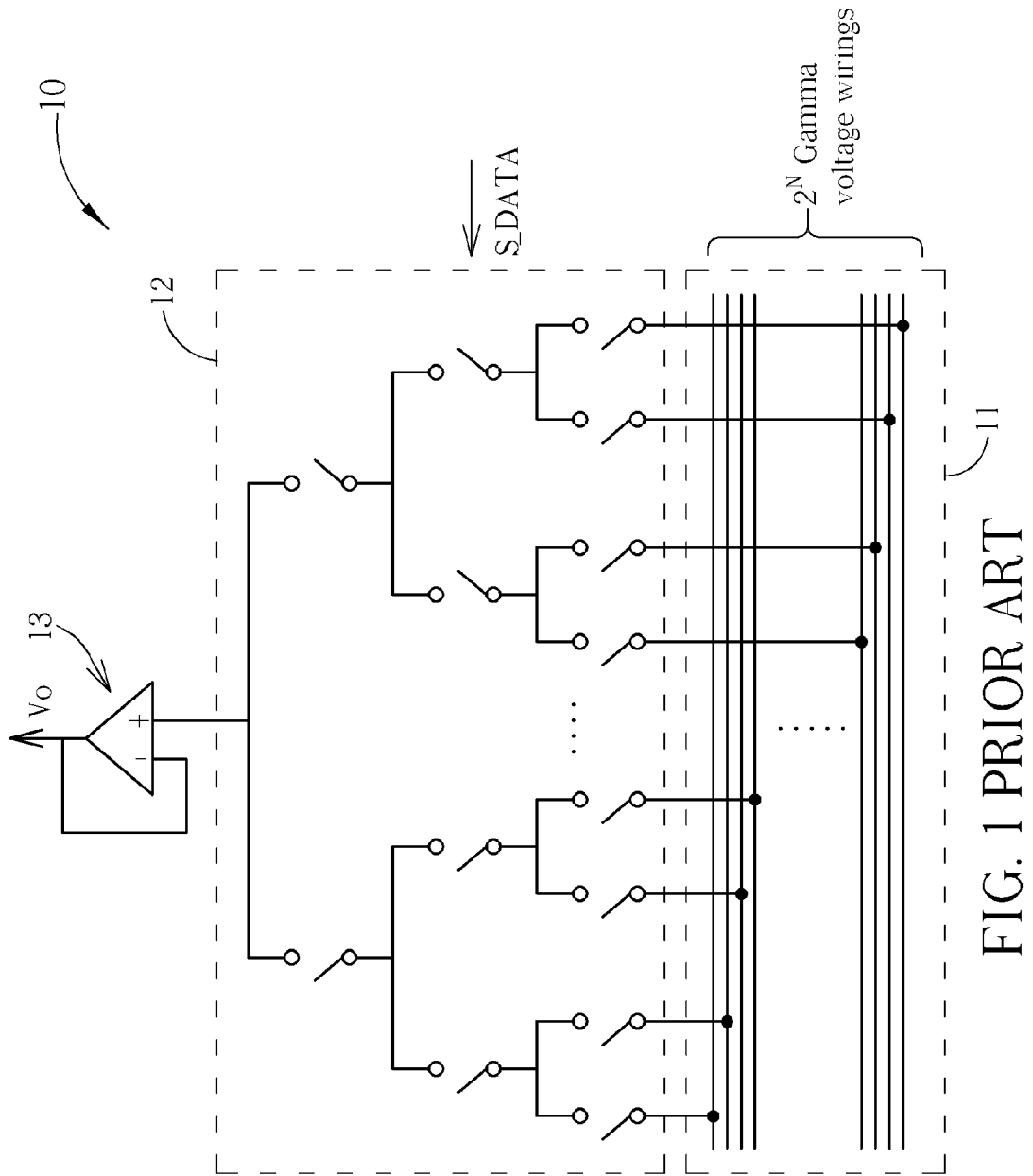
FIG. 1 is a schematic diagram of a driver chip in a conventional LCD panel.
Figure 2:
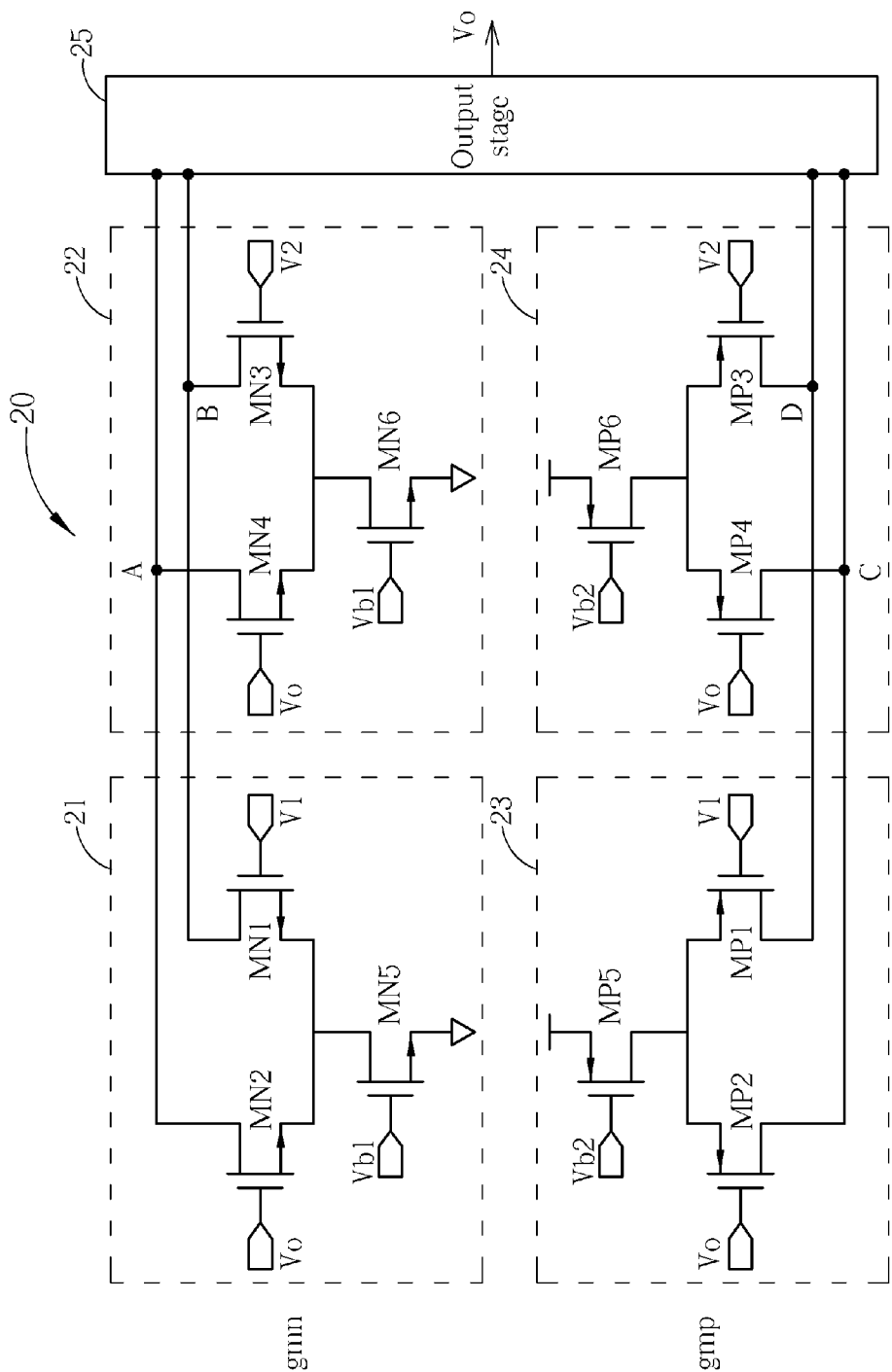
FIG. 2 is a schematic diagram of a conventional amplifier circuit with a voltage interpolation function.
Figure 3:
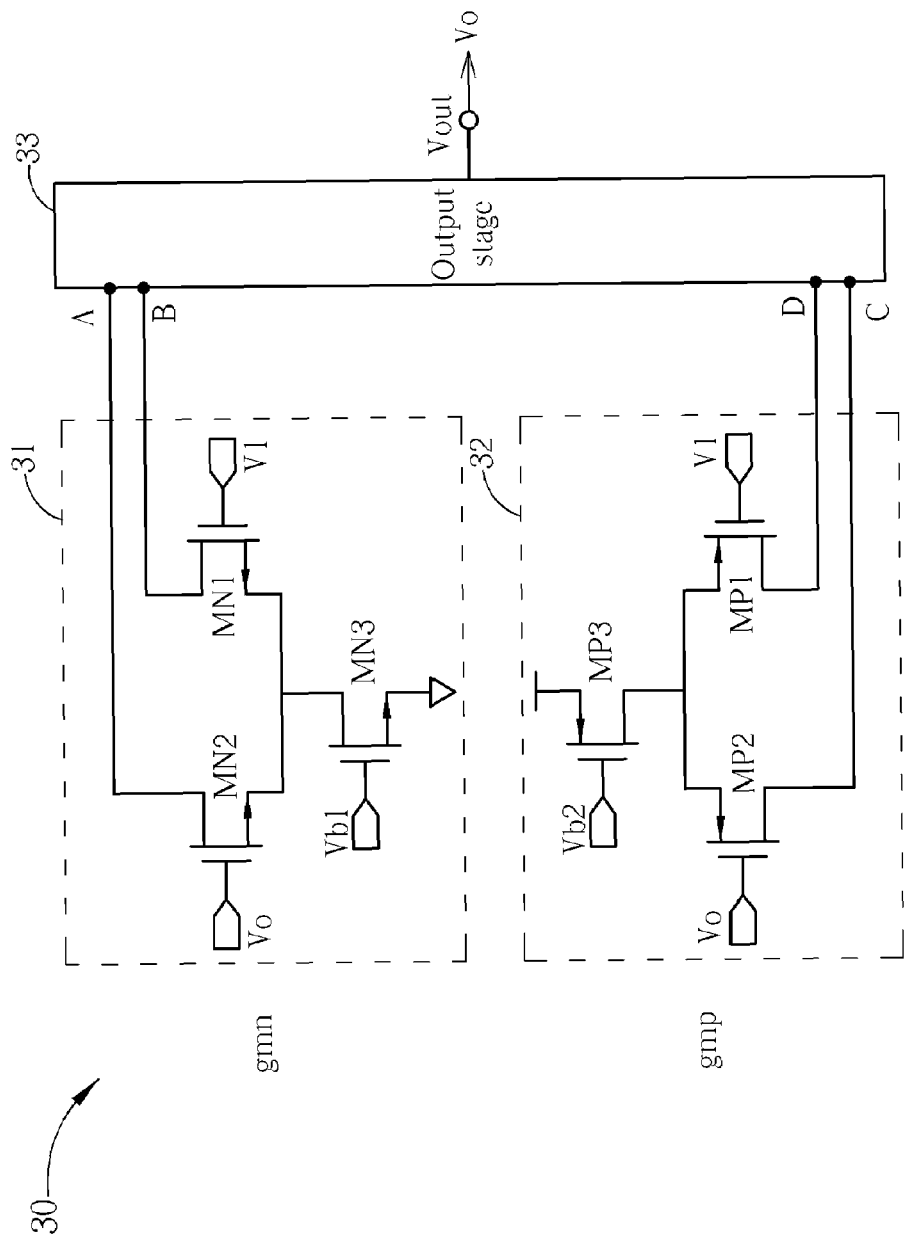
FIG. 3 is a schematic diagram of an amplifier circuit with a voltage interpolation function according to an embodiment of the present invention.

Please refer to FIG. 3. FIG. 3 is a schematic diagram of an amplifier circuit 30 with a voltage interpolation function according to an embodiment of the present invention. The amplifier circuit 30 may be utilized for performing voltage interpolation to generate an output voltage Vo according to input voltages V1 and V2, and includes an N-type differential pair 31, a P-type differential pair 32 and an output stage 33. The N-type differential pair 31 has a first transconductance gmn, and is formed with two matched transistors MN1 and MN2 and one biasing transistor MN3. Input terminals of the N-type differential pair 31, i.e. gate electrodes of the transistors MN1 and MN2, are respectively coupled to the first input voltage V1 and a voltage output terminal Vout, and output terminals of the N-type differential pair 31, i.e. drain electrodes of the transistors MN1 and MN2, are coupled to the output stage 33 through nodes A and B. The P-type differential pair 32 has a second transconductance gmp, and is formed with two matched transistors MP1 and MP2 and one biasing transistor MP3. Input terminals of the P-type differential pair 32, i.e. gate electrodes of the transistors MP1 and MP2, are respectively coupled to the second input voltage V2 and the voltage output terminal Vout, and output terminals of the P-type differential pair 32, i.e. drain electrodes of the transistors MP1 and MP2, are coupled to the output stage 33 through nodes C and D. The output stage 33 is coupled to the N-type differential pair 31, the P-type differential pair 32 and the voltage output terminal Vout, and is utilized for converting differential currents outputted by the N-type differential pair 31 and the P-type differential pair 32 to output a single-ended output voltage to the voltage output terminal Vout and providing adequate driving currents for rear stage circuits.

In operation, since the voltage output terminal Vout has feedback connections with the input terminals of the N-type differential pair 31 and the P-type differential pair 32, i.e. the gate electrodes of the transistors MN2 and MP2, the N-type differential pair 31 and the P-type differential pair 32 can be considered a voltage buffer. In this case, when observing the N-type differential pair 31 and the P-type differential pair 32 separately, the output voltage Vo generated by the N-type differential pair 31 and the P-type differential pair 32 is respectively proportional to the first input voltage V1 and the second input voltage V2. However, the N-type differential pair 31 and the P-type differential pair 32 have different transconductances, and by superposition, the voltage Vo outputted by the voltage output terminal Vout can thus be expressed as follows:

$$Vo = \frac{gmpV1 + gmnV2}{gmp + gmn}.$$

Therefore, by properly adjusting the transconductances of the N-type differential pair 31 and the P-type differential pair 32, the amplifier circuit 30 of the present invention can generate an interpolation result of the first voltage V1 and the second voltage V2 weighted by the first transconductance value gmn and the second transconductance value gmp. The adjustment of the transconductances of the N-type differential pair 31 and the P-type differential pair 32 can be achieved by adjusting corresponding bias currents, i.e. bias voltages of the transistors MN3 and MP3, or adjusting transistor sizes, which is well known by those in the art and not narrated herein.

Figure 4:
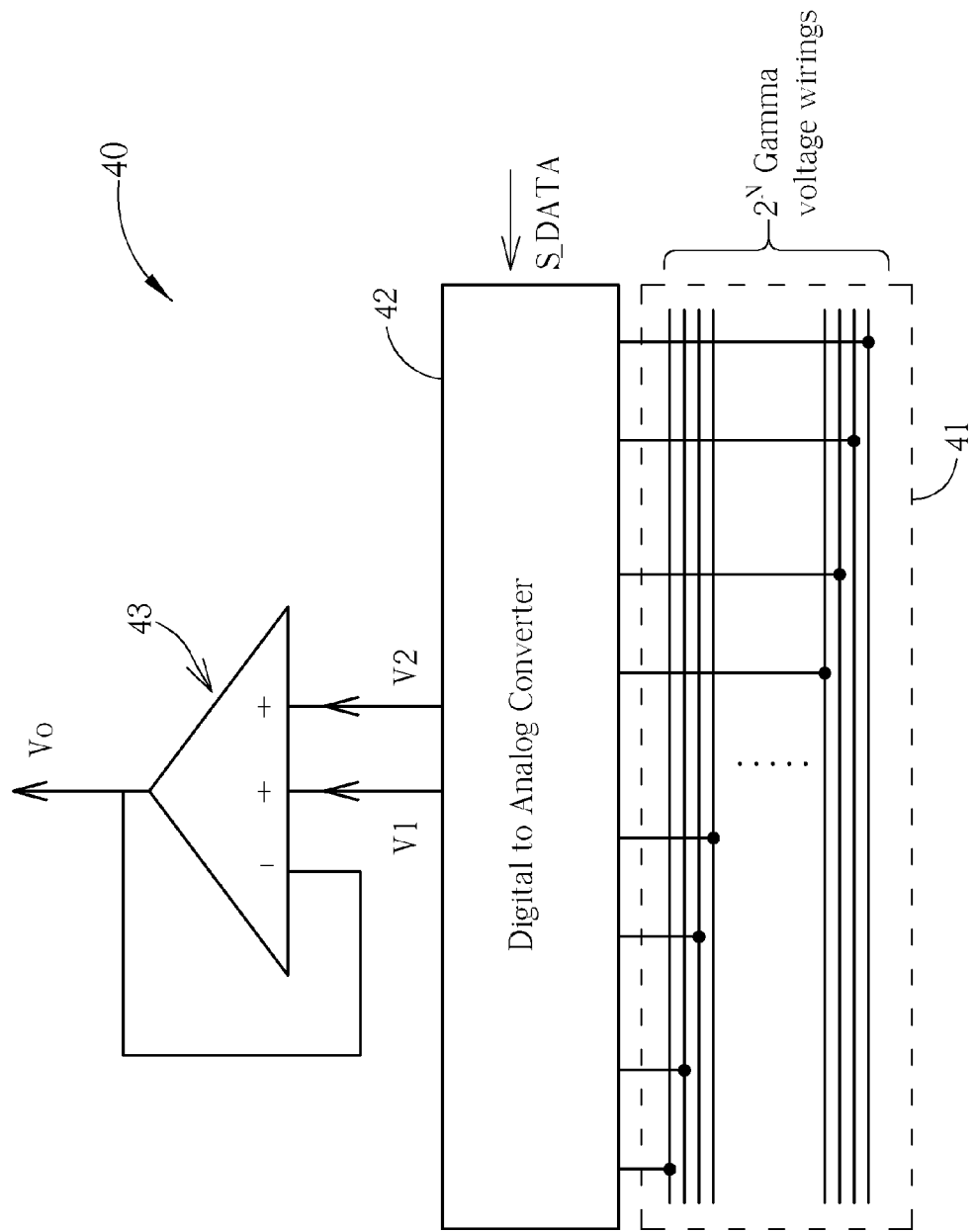
FIG. 4 is a schematic diagram of a driving device for a liquid crystal display according to an embodiment of the present invention.

Compared with the prior art, the amplifier circuit 30 of the present invention utilizes fewer differential pairs for realizing the same voltage interpolation function, so that circuit area can be reduced. Preferably, the amplifier circuit 30 can be applied in a driver chip of a liquid crystal display. For example, please refer to FIG. 4. FIG. 4 is a schematic diagram of a driving device 40 for a liquid crystal display according to an embodiment of the present invention. The driving device 40 includes $2^N$ reference voltage wirings 41, a digital-to-analog converter 42 and an amplifier circuit 43. The reference voltage wirings 41 are utilized for providing $2^N$ Gamma reference voltages generated by a reference voltage generator. The digital-to-analog converter 42 is coupled to the reference voltage wirings 41, and is utilized for switching to output two adjacent reference voltages V1 and V2 from the $2^N$ Gamma reference voltages according to a digital image signal S_DATA. The amplifier circuit 43 is realized by the amplifier circuit 30 in FIG. 3, and is utilized for generating an interpolation result Vo according to the reference voltages V1 and V2 outputted by the digital-to-analog converter 42. Certainly, if the value of the digital image signal S_DATA is equal to one of the $2^N$ reference voltages, the reference voltages V1 and V2 can both be outputted as the reference voltage corresponding to the digital image signal S_DATA, and the amplifier circuit 43 merely functions as a voltage buffer in this case.

Thus, by utilizing the amplifier circuit 43 to interpolate the $2^N$ Gamma reference voltages, the driving device 40 can generate $2^{N+1}$ reference voltages for saving half of the required reference voltage wirings and the number of circuit elements inside the digital-to-analog converter, so as to reduce chip sizes and production cost.

As mentioned above, the present invention utilizes fewer differential pairs to realize the amplifier circuit with the voltage interpolation function. Therefore, when applied in the driver chip of the liquid crystal display, the present invention can save half of the required reference voltage wirings and the number of circuit elements inside the digital-to-analog converters, so that the chip size and the production cost can be reduced significantly.

Those skilled in the art will readily observe that numerous modifications and alterations of the device and method may be made while retaining the teachings of the invention.

What is claimed is:

1. An amplifier circuit with a voltage interpolation function, the amplifier circuit comprising:
   an N-type differential pair having a first transconductance value, the N-type differential pair comprising a first differential input terminal coupled to a first voltage and a second differential input terminal coupled to a voltage output terminal; and
   a P-type differential pair having a second transconductance value, the P-type differential pair comprising a first differential input terminal coupled to a second voltage and a second differential input terminal coupled to the voltage output terminal;
   wherein the N-type differential pair and the P-type differential pair are further coupled to the voltage output terminal through an output stage, and an output voltage of the voltage output terminal is an interpolation result of the first voltage and the second voltage weighted by the first transconductance value and the second transconductance value.

2. The amplifier circuit of claim 1, wherein the N-type differential pair is a matched N-type field-effect transistor pair.

3. The amplifier circuit of claim 2, wherein the N-type differential pair comprises:
   a first N-type field-effect transistor comprising a gate electrode coupled to the first differential input terminal, a source electrode coupled to a bias current source, and a drain electrode coupled to the output stage; and
   a second N-type field-effect transistor comprising a gate electrode coupled to the second differential input terminal, a source electrode coupled to the bias current source, and a drain electrode coupled to the output stage;
   wherein the magnitude of the bias current source and the sizes of the first and the second N-type field-effect transistors are proportional to the first transconductance value.

4. The amplifier circuit of claim 1, wherein the P-type differential pair is a matched P-type field-effect transistor pair.

5. The amplifier circuit of claim 4, wherein the P-type differential pair comprises:
   a first P-type field-effect transistor comprising a gate electrode coupled to the first differential input terminal, a source electrode coupled to a bias current source, and a drain electrode coupled to the output stage; and
   a second P-type field-effect transistor comprising a gate electrode coupled to the second differential input terminal, a source electrode coupled to the bias current source, and a drain electrode coupled to the output stage;
   wherein the magnitude of the bias current source and the sizes of the first and the second P-type field-effect transistors are proportional to the second transconductance value.

6. The amplifier circuit of claim 1, wherein the output stage is utilized for converting differential currents outputted by the N-type differential pair and the P-type differential pair to a single-ended output voltage and providing driving currents for rear stage circuits.

7. A driving device of a liquid crystal display for reducing layout area, the driving device comprising:
   a digital-to-analog converter for outputting a first reference voltage and a second reference voltage from a plurality of reference voltages according to a digital signal, wherein the first reference voltage and the second reference voltage are adjacent reference voltages among the plurality of reference voltages; and
   a buffer amplifier coupled to the digital-to-analog converter, the buffer amplifier comprising:
      an N-type differential pair having a first transconductance value, the N-type differential pair comprising a first differential input terminal coupled to the first reference voltage and a second differential input terminal coupled to a voltage output terminal; and
      a P-type differential pair having a second transconductance value, the P-type differential pair comprising a first differential input terminal coupled to the second reference voltage and a second differential input terminal coupled to the voltage output terminal;
      wherein the N-type differential pair and the P-type differential pair are further coupled to the voltage output terminal through an output stage, and an output voltage of the voltage output terminal is an interpolation result of the first reference voltage and the second reference voltage weighted by the first transconductance value and the second transconductance value.

8. The driving device of claim 7, wherein the N-type differential pair is a matched N-type field-effect transistor pair.

9. The driving device of claim 8, wherein the N-type differential pair comprises:
   a first N-type field-effect transistor comprising a gate electrode coupled to the first differential input terminal, a source electrode coupled to a bias current source, and a drain electrode coupled to the output stage; and
   a second N-type field-effect transistor comprising a gate electrode coupled to the second differential input terminal, a source electrode coupled to the bias current source, and a drain electrode coupled to the output stage;
   wherein the magnitude of the bias current source and the sizes of the first and the second N-type field-effect transistors are proportional to the first transconductance value.

10. The driving device of claim 7, wherein the P-type differential pair is a matched P-type field-effect transistor pair.

11. The driving device of claim 10, wherein the P-type differential pair comprises:
   a first P-type field-effect transistor comprising a gate electrode coupled to the first differential input terminal, a source electrode coupled to a bias current source, and a drain electrode coupled to the output stage; and
   a second P-type field-effect transistor comprising a gate electrode coupled to the second differential input terminal, a source electrode coupled to the bias current source, and a drain electrode coupled to the output stage;

wherein the magnitude of the bias current source and the sizes of the first and the second P-type field-effect transistors are proportional to the second transconductance value.

12. The driving device of claim 7, wherein the output stage is utilized for converting differential currents outputted by the N-type differential pair and the P-type differential pair to a single-end output voltage and providing driving currents for rear stage circuits.

* * * * *